US012740134B2

(12) United States Patent
Lin

(10) Patent No.: US 12,740,134 B2
(45) Date of Patent: Sep. 15, 2026

(54) MANUFACTURING METHOD OF SEMICONDUCTOR STRUCTURE

(71) Applicant: Powerchip Semiconductor Manufacturing Corporation, Hsinchu (TW)

(72) Inventor: Meng-Han Lin, Hsinchu City (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 372 days.

(21) Appl. No.: 18/644,125

(22) Filed: Apr. 24, 2024

(65) Prior Publication Data

US 2025/0311385 A1 Oct. 2, 2025

(30) Foreign Application Priority Data

Apr. 2, 2024 (TW) ................................ 113112512

(51) Int. Cl.
*H01L 21/8234* (2006.01)
*H01L 21/285* (2006.01)
(Continued)

(52) U.S. Cl.
CPC ....... *H10D 84/038* (2025.01); *H10D 64/0112* (2026.01); *H10D 84/013* (2025.01);
(Continued)

(58) Field of Classification Search
CPC ............. H10D 84/0151; H10D 84/013; H10D 84/0144; H10D 84/0156; H10D 84/929; H10D 84/931; H10W 10/00; H10W 10/10; H10W 10/011; H10W 10/014; H10W 10/0142; H10W 10/0143; H10W 10/0148; H10W 10/01; H10W 10/17; H10W 10/50; H10W 10/40
See application file for complete search history.

(56) References Cited

U.S. PATENT DOCUMENTS 9,799,570 B1 * 10/2017 Cheng ................ H10D 30/0243
2023/0154980 A1 * 5/2023 Tsai .................. H10D 30/0227
257/386

(Continued)

FOREIGN PATENT DOCUMENTS

TW 201946218 12/2019
TW 202034496 9/2020

(Continued)

OTHER PUBLICATIONS

"Notice of allowance of Taiwan Counterpart Application", issued on Jan. 6, 2025, p. 1-p. 4.

*Primary Examiner* — Lawrence C Tynes, Jr.
(74) *Attorney, Agent, or Firm* — JCIPRNET

(57) ABSTRACT

A manufacturing method of a semiconductor structure including the following steps is provided. A substrate is provided. A semiconductor layer is formed in the substrate. A portion of the semiconductor layer and a portion of the substrate are removed to form a trench in the substrate. An isolation structure is formed in the trench. After the isolation structure is formed, the semiconductor layer is removed to form a first recess in the substrate. A gate dielectric layer is formed on the substrate exposed by the first recess.

20 Claims, 9 Drawing Sheets

(51) Int. Cl.

| | |
|---|---|
| ***H10D 64/01*** | (2025.01) |
| ***H10D 84/01*** | (2025.01) |
| ***H10D 84/03*** | (2025.01) |

(52) U.S. Cl.

CPC ..... *H10D 84/0142* (2025.01); *H10D 84/0144* (2025.01); *H10D 84/0151* (2025.01); *H10D 84/0156* (2025.01)

(56) References Cited

U.S. PATENT DOCUMENTS

| | | | |
|---|---|---|---|
| 2023/0343850 | A1 | 10/2023 | Chen et al. |
| 2023/0387110 | A1 | 11/2023 | Song et al. |

FOREIGN PATENT DOCUMENTS

| | | |
|---|---|---|
| TW | I737535 | 8/2021 |
| TW | 202133434 | 9/2021 |

* cited by examiner

MANUFACTURING METHOD OF SEMICONDUCTOR STRUCTURE

CROSS-REFERENCE TO RELATED APPLICATION

This application claims the priority benefit of Taiwan application serial no. 113112512, filed on Apr. 2, 2024. The entirety of the above-mentioned patent application is hereby incorporated by reference herein and made a part of this specification.

BACKGROUND

Technical Field

The invention relates to a manufacturing method of a semiconductor structure, and particularly relates to a manufacturing method of a semiconductor structure including a gate dielectric layer.

Description of Related Art

In the semiconductor device (e.g., transistor device), the gate dielectric layer is disposed between the gate and the substrate. However, when the thickness of the gate dielectric layer is uneven (e.g., edge thinning), the electrical performance of the semiconductor device will be reduced (e.g., the breakdown voltage of the high-voltage transistor device will be reduced).

SUMMARY

The invention provides a manufacturing method of a semiconductor structure, which can effectively improve the electrical performance of the semiconductor device.

The invention provides a manufacturing method of a semiconductor structure, which includes the following steps. A substrate is provided. A semiconductor layer is formed in the substrate. A portion of the semiconductor layer and a portion of the substrate are removed to form a trench in the substrate. An isolation structure is formed in the trench. After the isolation structure is formed, the semiconductor layer is removed to form a first recess in the substrate. A gate dielectric layer is formed on the substrate exposed by the first recess.

According to an embodiment of the invention, in the manufacturing method of the semiconductor structure, the material of the semiconductor layer is, for example, silicon germanium (SiGe).

According to an embodiment of the invention, in the manufacturing method of the semiconductor structure, the method of forming the semiconductor layer may include the following steps. A pad layer is formed on the substrate. The pad layer and the substrate are patterned to form a second recess in the substrate. A semiconductor material layer is formed in the second recess. The top surface of the semiconductor material layer may be higher than the top surface of the pad layer. A portion of the semiconductor material layer is removed to form the semiconductor layer. The top surface of the semiconductor layer may be lower than the top surface of the pad layer.

According to an embodiment of the invention, in the manufacturing method of the semiconductor structure, the method of forming the semiconductor material layer is, for example, an epitaxial growth method.

According to an embodiment of the invention, in the manufacturing method of the semiconductor structure, the method of removing the portion of the semiconductor material layer is, for example, an etch-back method, a chemical mechanical polishing (CMP) method, or a combination thereof.

According to an embodiment of the invention, the manufacturing method of the semiconductor structure may further include the following step. After the isolation structure is formed, the pad layer is removed.

According to an embodiment of the invention, in the manufacturing method of the semiconductor structure, the method of removing the pad layer is, for example, a wet etching method.

According to an embodiment of the invention, in the manufacturing method of the semiconductor structure, the bottom of the trench adjacent to the semiconductor layer may be lower than the bottom of the trench away from the semiconductor layer.

According to an embodiment of the invention, in the manufacturing method of the semiconductor structure, the thickness of the portion of the isolation structure adjacent to the gate dielectric layer may be greater than the thickness of the portion of the isolation structure away from the gate dielectric layer.

According to an embodiment of the invention, in the manufacturing method of the semiconductor structure, the method of removing the semiconductor layer is, for example, a wet etching method.

According to an embodiment of the invention, in the manufacturing method of the semiconductor structure, the method of forming the gate dielectric layer is, for example, a thermal oxidation method.

According to an embodiment of the invention, the manufacturing method of the semiconductor structure may further include the following steps. A first well region is formed in the substrate. A second well region is formed in the first well region. The second well region may be located directly below the gate dielectric layer.

According to an embodiment of the invention, in the manufacturing method of the semiconductor structure, a portion of the first well region may be located directly below the isolation structure.

According to an embodiment of the invention, the manufacturing method of the semiconductor structure may further include the following step. A gate is formed on the gate dielectric layer.

According to an embodiment of the invention, in the manufacturing method of the semiconductor structure, a portion of the gate may be located on the isolation structure.

According to an embodiment of the invention, in the manufacturing method of the semiconductor structure, the gate may be a metal gate.

According to an embodiment of the invention, the manufacturing method of the semiconductor structure may further include the following step. A spacer is formed on the sidewall of the gate.

According to an embodiment of the invention, the manufacturing method of the semiconductor structure may further include the following step. A first doped region and a second doped region are formed in the substrate on two sides of the gate.

According to an embodiment of the invention, the manufacturing method of the semiconductor structure may further include the following step. A first metal silicide layer and a second metal silicide layer are respectively formed on the first doped region and the second doped region.

According to an embodiment of the invention, the manufacturing method of the semiconductor structure may further include the following steps. A high dielectric constant (high-k) dielectric layer is formed between the gate and the gate dielectric layer. A cap layer is formed between the gate and the high dielectric constant dielectric layer.

Based on the above description, in the manufacturing method of the semiconductor structure according to the invention, after the isolation structure is formed, the semiconductor layer is removed to form the first recess in the substrate. The gate dielectric layer is formed on the substrate exposed by the first recess. Therefore, the gate dielectric layer can have uniform thickness, thereby improving the electrical performance of the semiconductor device (e.g., transistor device).

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

FIG. 1A to FIG. 1I are cross-sectional views of a manufacturing process of a semiconductor structure according to some embodiments of the invention.

Figure 1A:
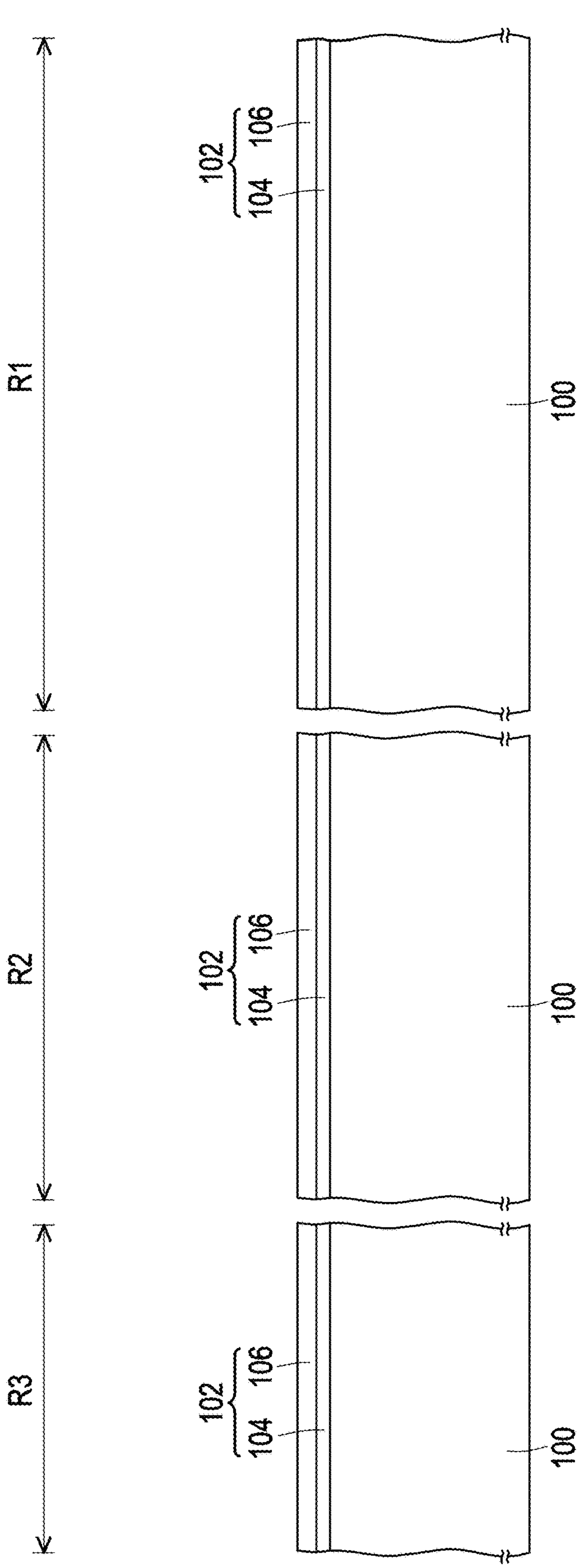
FIG. 1A to FIG. 1I are cross-sectional views of a manufacturing process of a semiconductor structure according to some embodiments of the invention.

Referring to FIG. 1A, a substrate 100 is provided. The substrate 100 may have a first region R1, a second region R2, and a third region R3. In some embodiments, the first region R1 may be a high-voltage device region (e.g., high-voltage transistor device region), the second region R2 may be a medium-voltage device region (e.g., medium-voltage transistor device region), and the third region R3 may be a low-voltage device region (e.g., low-voltage transistor device region). In some embodiments, the substrate 100 may be a semiconductor substrate such as a silicon substrate.

A pad layer 102 may be formed on the substrate 100. The pad layer 102 may be a single-layer structure or a multilayer structure. In the present embodiment, the pad layer 102 may be a multilayer structure. For example, the pad layer 102 may include a pad layer 104 and a pad layer 106. The Pad layer 104 is located on the substrate 100. In some embodiments, the material of the pad layer 104 is, for example, silicon oxide. In some embodiments, the method of forming the pad layer 104 is, for example, a thermal oxidation method. The pad layer 106 is located on the pad layer 104. In some embodiments, the material of the pad layer 106 is, for example, silicon nitride. In some embodiments, the method of forming the pad layer 106 is, for example, a chemical vapor deposition (CVD) method.

Figure 1B:
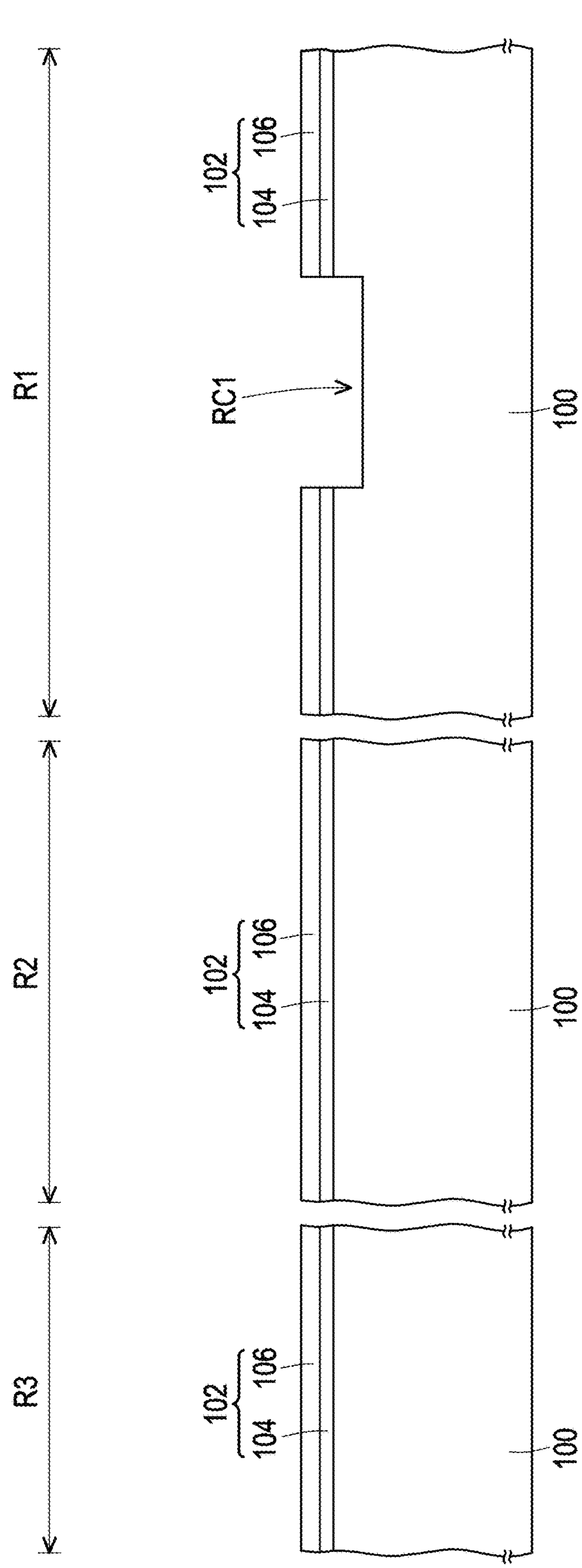

Referring to FIG. 1B, the pad layer 102 and the substrate 100 may be patterned to form a recess RC1 in the substrate 100. The recess RC1 may be located in the first region R1. In some embodiments, the pad layer 102 and the substrate 100 may be patterned by a lithography process and an etching process.

Figure 1C:
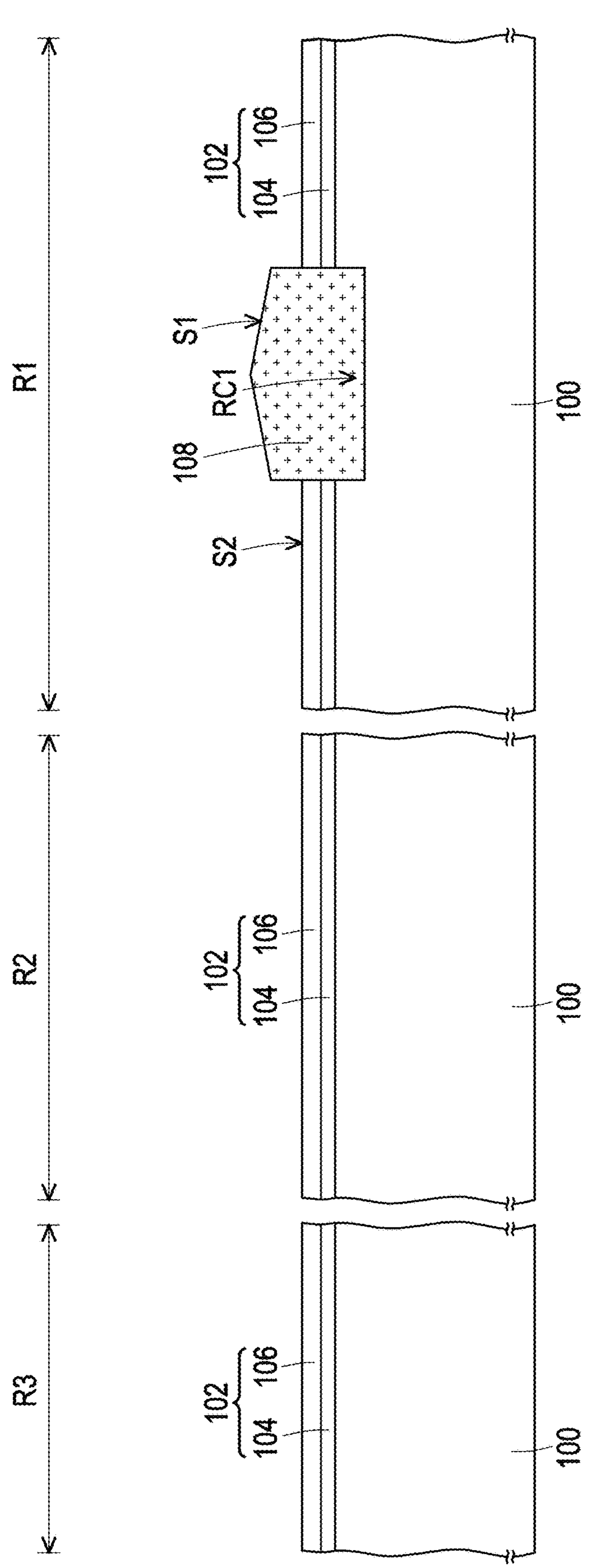

Referring to FIG. 1C, a semiconductor material layer 108 may be formed in the recess RC1. In some embodiments, the top surface S1 of the semiconductor material layer 108 may be higher than the top surface S2 of the pad layer 102. In some embodiments, the semiconductor material layer 108 may be an epitaxial layer. In some embodiments, the material of the semiconductor material layer 108 is, for example, silicon germanium. In some embodiments, the method of forming the semiconductor material layer 108 is, for example, an epitaxial growth method.

Figure 1D:
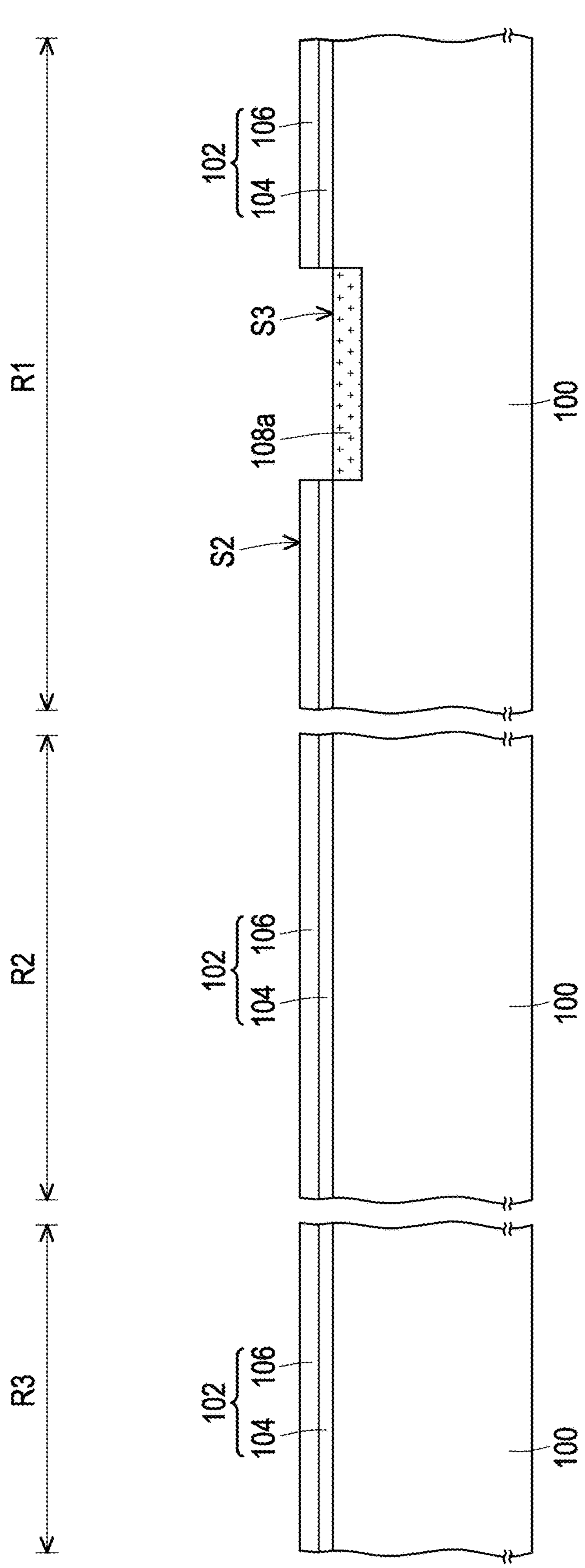

Referring to FIG. 1D, a portion of the semiconductor material layer 108 may be removed to form a semiconductor layer 108*a*. Therefore, the semiconductor layer 108*a* may be formed in the substrate 100 in the first region R1. The top surface S3 of the semiconductor layer 108*a* may be lower than the top surface S2 of the pad layer 102. In some embodiments, the material of the semiconductor layer 108*a* is, for example, silicon germanium. In some embodiments, the method of removing the portion of the semiconductor material layer 108 is, for example, an etch-back method, a chemical mechanical polishing method, or a combination thereof.

Figure 1E:
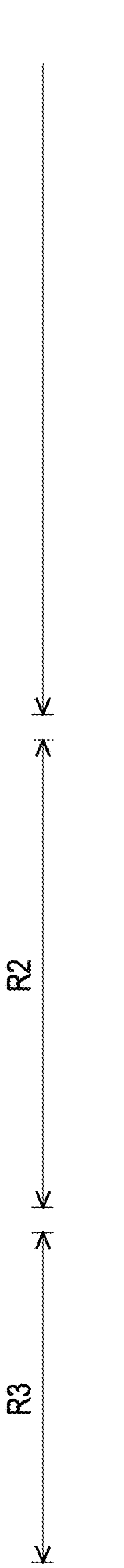
Figure 1E:
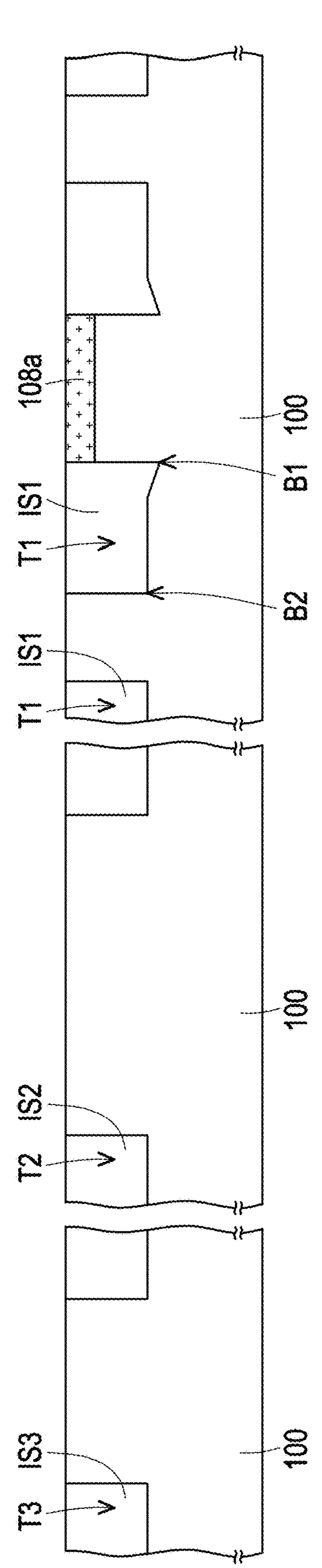

Referring to FIG. 1E, a portion of the pad layer 102, a portion of the semiconductor layer 108*a*, and a portion of the substrate 100 in the first region R1 is removed to form a trench T1 in the substrate 100. In some embodiments, the trench T1 may be formed by patterning the pad layer 102, the semiconductor layer 108*a*, and the substrate 100 by a lithography process and an etching process. In some embodiments, when the substrate 100 is a silicon substrate and the material of the semiconductor layer 108*a* is silicon germanium, in the etching process used to form the trench T1, the etching rate of the semiconductor layer 108*a* may be greater than the etching rate of the substrate 100, so that the bottom B1 of the trench T1 adjacent to the semiconductor layer 108*a* may be lower than the bottom B2 of the trench T1 away from the semiconductor layer 108*a*. In addition, a portion of the pad layer 102 and a portion of the substrate 100 in the second region R2 may be removed to form a trench T2 in the substrate 100. In addition, a portion of the pad layer 102 and a portion of the substrate 100 in the third region R3 may be removed to form a trench T3 in the substrate 100. In some embodiments, the trench T1, the trench T2, and the trench T3 may be simultaneously formed in the same process.

An isolation structure IS1 is formed in the trench T1. In addition, an isolation structure IS2 may be formed in the trench T2, and an isolation structure IS3 may be formed in the trench T3. In some embodiments, the isolation structure IS1, the isolation structure IS2, and the isolation structure IS3 are, for example, shallow trench isolation (STI) structures. In some embodiments, the materials of the isolation structure IS1, the isolation structure IS2, and the isolation structure IS3 are, for example, dielectric materials such as silicon oxide. In some embodiments, the isolation structure IS1, the isolation structure IS2, and the isolation structure IS3 may be formed by a shallow trench isolation structure process. In some embodiments, the isolation structure IS1, the isolation structure IS2, and the isolation structure IS3 may be simultaneously formed in the same process.

After the isolation structure IS1, the isolation structure IS2, and the isolation structure IS3 are formed, the pad layer 102 may be removed. In some embodiments, the method of removing the pad layer 102 is, for example, a wet etching method.

Figure 1F:
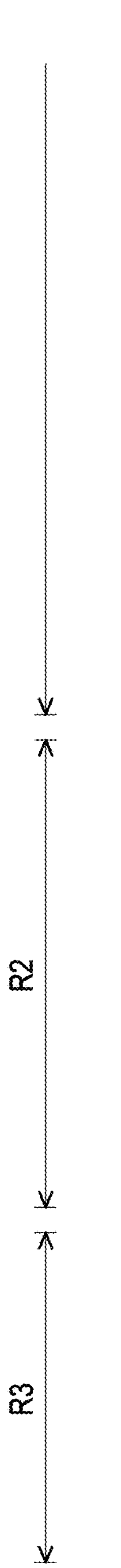
Figure 1F:
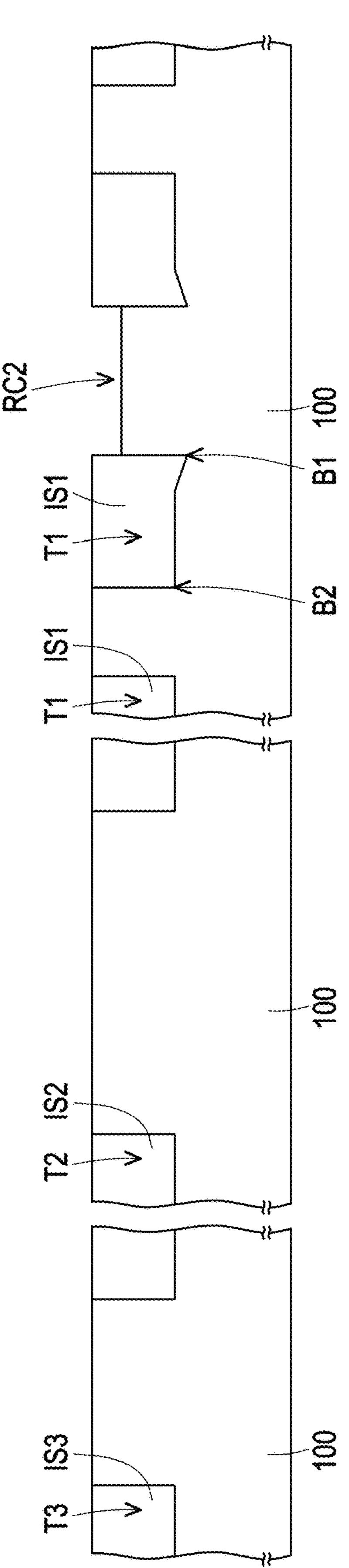

Referring to FIG. 1F, after the isolation structure IS1 is formed, the semiconductor layer 108*a* is removed to form a recess RC2 in the substrate 100. In some embodiments, the method of removing the semiconductor layer 108*a* is, for example, a wet etching method.

Figure 1G:
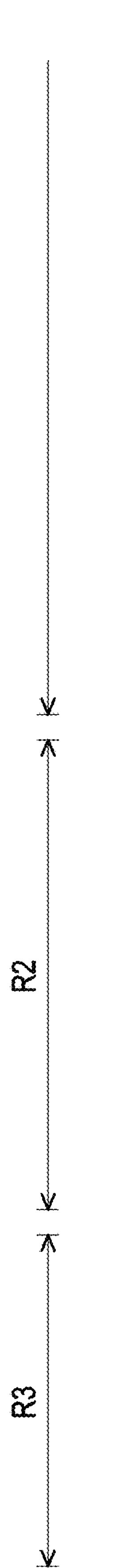
Figure 1G:
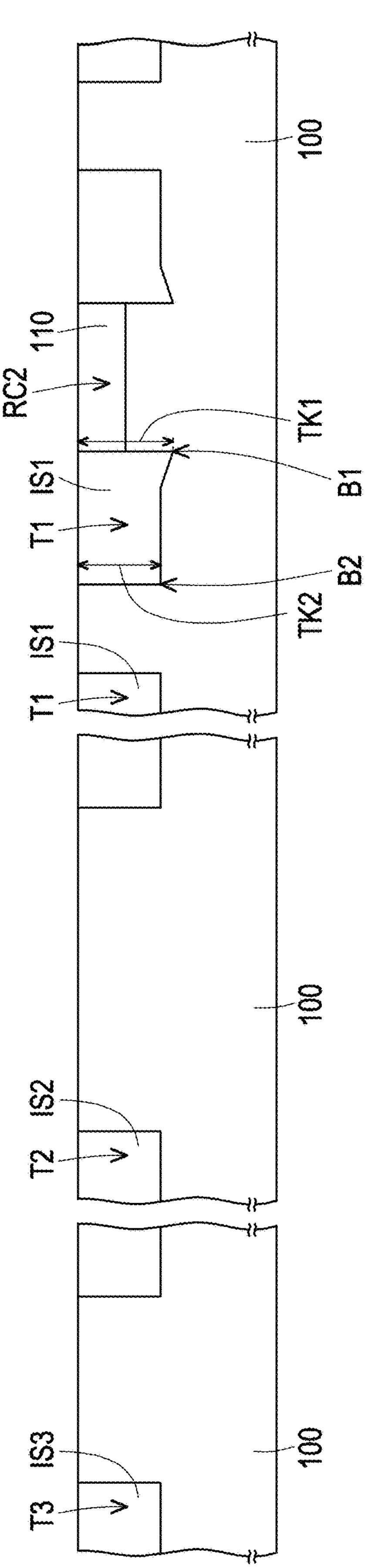

Referring to FIG. 1G, a gate dielectric layer 110 is formed on the substrate 100 exposed by the recess RC2. In some embodiments, the thickness TK1 of the portion of the isolation structure IS1 adjacent to the gate dielectric layer 110 may be greater than the thickness TK2 of the portion of the isolation structure IS1 away from the gate dielectric layer 110. In some embodiments, the material of the gate dielectric layer 110 is, for example, silicon oxide. In some embodiments, the method of forming the gate dielectric layer 110 is, for example, a thermal oxidation method.

Figure 1H:
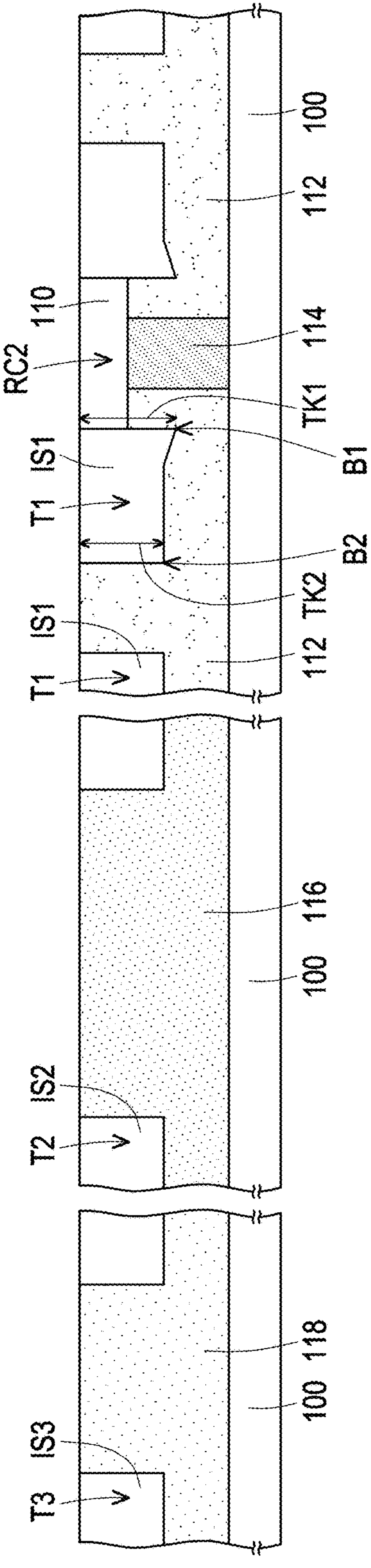

Referring to FIG. 1H, a well region 112 may be formed in the substrate 100 in the first region R1. In addition, a well region 114 may be formed in the well region 112. The well region 114 may be located directly below the gate dielectric layer 110. A portion of the well region 112 may be located directly below the isolation structure IS1. In addition, a well region 116 may be formed in the substrate 100 in the second region R2, and a well region 118 may be formed in the substrate 100 in the third region R3. In some embodiments, the well region 112 may have a first conductivity type (e.g., N-type), and the well region 114, the well region 116, and the well region 118 may have a second conductivity type (e.g., P-type). The first conductivity type and the second conductivity type may be different conductivity types.

Figure 1I:
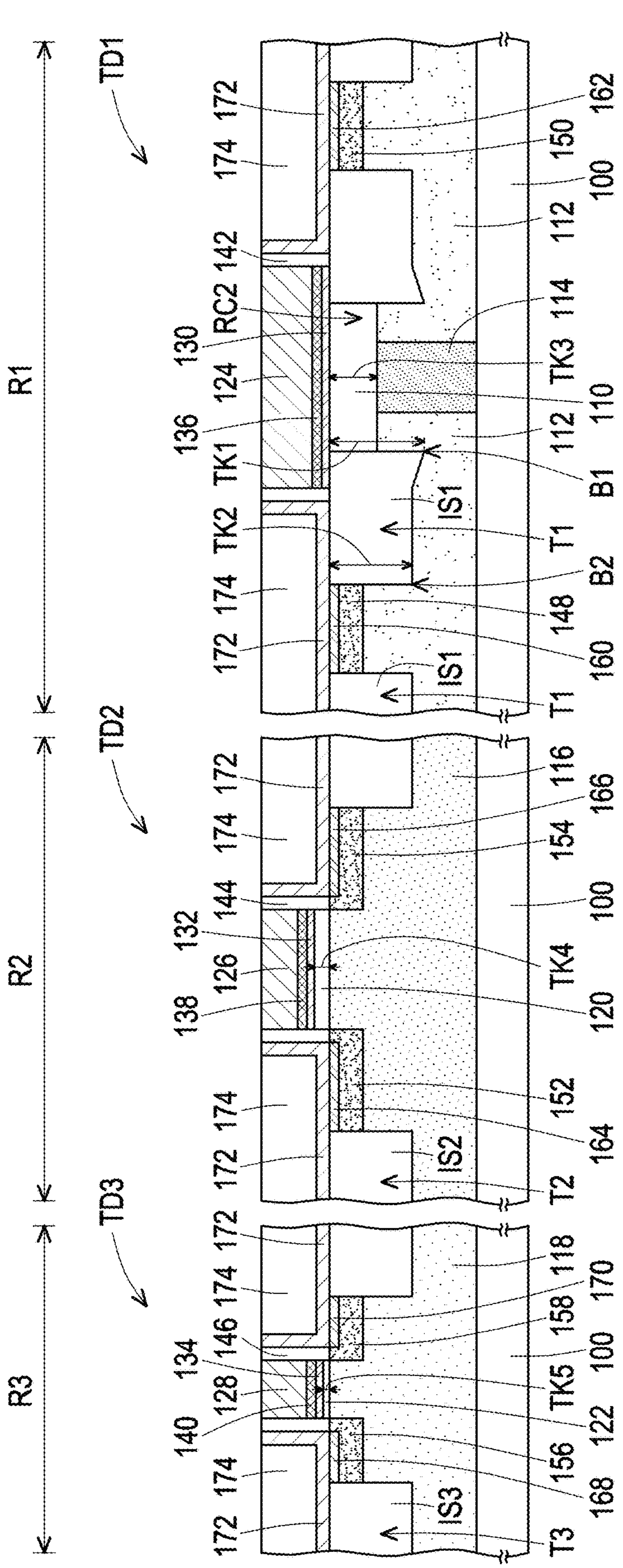

Referring to FIG. 1I, a gate dielectric layer 120 may be formed on the substrate 100 in the second region R2. In some embodiments, the material of the gate dielectric layer 120 is, for example, silicon oxide. In addition, a gate dielectric layer 122 may be formed on the substrate 100 in the third region R3. In some embodiments, the material of the gate dielectric layer 122 is, for example, silicon oxide. In some embodiments, the thickness TK3 of the gate dielectric layer 110 may be greater than the thickness TK4 of the gate dielectric layer 120, and the thickness TK4 of the gate dielectric layer 120 may be greater than the thickness TK5 of the gate dielectric layer 122.

In some embodiments, a gate 124 may be formed on the gate dielectric layer 110. A portion of the gate 124 may be located on the isolation structure IS1. In some embodiments, a gate 126 may be formed on the gate dielectric layer 120, and a gate 128 may be formed on the gate dielectric layer 122. In some embodiments, the gate 124, the gate 126, and the gate 128 may be metal gates. In some embodiments, the materials of the gate 124, the gate 126, and the gate 128 may include N-type metal, such as aluminum, tantalum, titanium, hafnium, zirconium, titanium silicide, tantalum nitride, tantalum silicon nitride (TaSiN), chromium, tungsten, copper, or titanium aluminum. In some embodiments, the materials of the gate 124, the gate 126, and the gate 128 may include P-type metal, such as nickel, cobalt, molybdenum, platinum, lead, gold, tantalum nitride, molybdenum silicide, ruthenium, chromium, tungsten, or copper.

In some embodiments, a high dielectric constant (high-k) dielectric layer 130 may be formed between the gate 124 and the gate dielectric layer 110, a high dielectric constant dielectric layer 132 may be formed between the gate 126 and the gate dielectric layer 120, and a high dielectric constant dielectric layer 134 may be formed between the gate 128 and the gate dielectric layer 122. In some embodiments, the materials of the high dielectric constant dielectric layer 130, the high dielectric constant dielectric layer 132, and the high dielectric constant dielectric layer 134 are, for example, $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, BaZrO, HfZrO, HfLaO, HfSiO, LaSiO, AlSiO, HfTaO, HfTiO, $Al_2O_3$, $Si_3N_4$, SiON, or combinations thereof.

In some embodiments, a cap layer 136 may be formed between the gate 124 and the high dielectric constant dielectric layer 130, a cap layer 138 may be formed between the gate 126 and the high dielectric constant dielectric layer 132, and a cap layer 140 may be formed between the gate 128 and the dielectric layers 134. In some embodiments, the materials of the cap layer 136, the cap layer 138, and the cap layer 140 are, for example, titanium nitride (TiN).

In some embodiments, the gate 124, the gate 126, the gate 128, the high dielectric constant dielectric layer 130, the high dielectric constant dielectric layer 132, the high dielectric constant dielectric layer 134, the cap layer 136, the cap layer 138, and the cap layer 140 may be formed by a high-k metal gate (HKMG) technology, but the invention is not limited thereto.

In some embodiments, a spacer 142 may be formed on the sidewall of the gate 124, a spacer 144 may be formed on the sidewall of the gate 126, and a spacer 146 may be formed on the sidewall of the gate 128. The spacer 142, the spacer 144, and the spacer 146 may be a single-layer structure or a multilayer structure. In some embodiments, the materials of the spacer 142, the spacer 144, and the spacer 146 are, for example, silicon oxide, silicon nitride, or combinations thereof.

In some embodiments, a doped region 148 and a doped region 150 may be formed in the substrate 100 on two sides of the gate 124, a doped region 152 and a doped region 154 may be formed in the substrate 100 on two sides of the gate 126, and a doped region 156 and a doped region 158 may be formed in the substrate 100 on two sides of the substrate 128. The doped region 148 and the doped region 150 may be used as the source region or the drain region of the transistor device TD1 in the first region R1, and the doped region 152 and the doped region 154 may be used as the source region or the drain region of the transistor device TD2 in the second region R2, and the doped region 156 and the doped region 158 may be used as the source region or the drain region of the transistor device TD3 in the third region R3.

In some embodiments, a metal silicide layer 160 and a metal silicide layer 162 may be respectively formed on the doped region 148 and the doped region 150, a metal silicide layer 164 and a metal silicide layer 166 may be respectively formed on the doped region 152 and the doped region 154, and a metal silicide layer 168 and a metal silicide layer 170 may be respectively formed on the doped region 156 and the doped region 158. In some embodiments, the materials of the metal silicide layer 160, the metal silicide layer 162, the metal silicide layer 164, the metal silicide layer 166, the metal silicide layer 168, and the metal silicide layer 170 are, for example, nickel silicide or cobalt silicide.

In some embodiments, a stop layer 172 may be formed on the isolation structure IS1, the isolation structure IS2, the isolation structure IS3, the spacer 142, the spacer 144, the spacer 146, the metal silicide layer 160, the metal silicide layer 162, the metal silicide layer 164, the metal silicide layer 166, the metal the silicide layer 168, and the metal silicide layer 170. In some embodiments, the stop layer 172 may be a contact etch stop layer (CESL). In some embodiments, the material of the stop layer 172 is, for example, silicon nitride. In some embodiments, a dielectric layer 174 may be formed on the stop layer 172. In some embodiments, the material of the dielectric layer 174 is, for example, silicon oxide.

By the above method, the transistor device TD1 may be formed in the first region R1, the transistor device TD2 may be formed in the second region R2, and the transistor device TD3 may be formed in the third region R3. In some embodiments, the transistor device TD1 may be a high-voltage transistor device, the transistor device TD2 may be a medium-voltage transistor device, and the transistor device TD3 may be a low-voltage transistor device.

Based on the above embodiments, in the above manufacturing method of the semiconductor structure, after the isolation structure IS1 is formed, the semiconductor layer 108*a* is removed to form the recess RC2 in the substrate 100. The gate dielectric layer 110 is formed on the substrate 100 exposed by the recess RC2. Therefore, the gate dielectric layer 110 can have uniform thickness, thereby improving the electrical performance of the semiconductor device (e.g., transistor device TD1).

In summary, in the manufacturing method of the semiconductor structure of the aforementioned embodiments, after the isolation structure is formed, the semiconductor layer is removed to form the recess in the substrate. The gate dielectric layer is formed on the substrate exposed by the recess. Therefore, the gate dielectric layer can have uniform thickness, thereby improving the electrical performance of the semiconductor device (e.g., transistor device).

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a semiconductor structure, comprising:
- providing a substrate;
- forming a semiconductor layer in the substrate;
- removing a portion of the semiconductor layer and a portion of the substrate to form a trench in the substrate;
- forming an isolation structure in the trench;
- after forming the isolation structure, removing the semiconductor layer to form a first recess in the substrate; and
- forming a gate dielectric layer on the substrate exposed by the first recess.

2. The manufacturing method of the semiconductor structure according to claim 1, wherein a material of the semiconductor layer comprises silicon germanium.

3. The manufacturing method of the semiconductor structure according to claim 1, wherein a method of forming the semiconductor layer comprises:
- forming a pad layer on the substrate;
- patterning the pad layer and the substrate to form a second recess in the substrate;
- forming a semiconductor material layer in the second recess, wherein a top surface of the semiconductor material layer is higher than a top surface of the pad layer; and
- removing a portion of the semiconductor material layer to form the semiconductor layer, wherein a top surface of the semiconductor layer is lower than the top surface of the pad layer.

4. The manufacturing method of the semiconductor structure according to claim 3, wherein a method of forming the semiconductor material layer comprises an epitaxial growth method.

5. The manufacturing method of the semiconductor structure according to claim 3, wherein a method of removing the portion of the semiconductor material layer comprises an etch-back method, a chemical mechanical polishing method, or a combination thereof.

6. The manufacturing method of the semiconductor structure according to claim 3, further comprising:
- after forming the isolation structure, removing the pad layer.

7. The manufacturing method of the semiconductor structure according to claim 6, wherein a method of removing the pad layer comprises a wet etching method.

8. The manufacturing method of the semiconductor structure according to claim 1, wherein a bottom of the trench adjacent to the semiconductor layer is lower than a bottom of the trench away from the semiconductor layer.

9. The manufacturing method of the semiconductor structure according to claim 1, wherein a thickness of a portion of the isolation structure adjacent to the gate dielectric layer is greater than a thickness of a portion of the isolation structure away from the gate dielectric layer.

10. The manufacturing method of the semiconductor structure according to claim 1, wherein a method of removing the semiconductor layer comprises a wet etching method.

11. The manufacturing method of the semiconductor structure according to claim 1, wherein a method of forming the gate dielectric layer comprises a thermal oxidation method.

12. The manufacturing method of the semiconductor structure according to claim 1, further comprising:
- forming a first well region in the substrate; and
- forming a second well region in the first well region, wherein the second well region is located directly below the gate dielectric layer.

13. The manufacturing method of the semiconductor structure according to claim 12, wherein a portion of the first well region is located directly below the isolation structure.

14. The manufacturing method of the semiconductor structure according to claim 1, further comprising:
- forming a gate on the gate dielectric layer.

15. The manufacturing method of the semiconductor structure according to claim 14, wherein a portion of the gate is located on the isolation structure.

16. The manufacturing method of the semiconductor structure according to claim 14, wherein the gate comprises a metal gate.

17. The manufacturing method of the semiconductor structure according to claim 14, further comprising:
- forming a spacer on a sidewall of the gate.

18. The manufacturing method of the semiconductor structure according to claim 14, further comprising:
- forming a first doped region and a second doped region in the substrate on two sides of the gate.

19. The manufacturing method of the semiconductor structure according to claim 18, further comprising:
- respectively forming a first metal silicide layer and a second metal silicide layer on the first doped region and the second doped region.

20. The manufacturing method of the semiconductor structure according to claim 14, further comprising:

forming a high dielectric constant dielectric layer between the gate and the gate dielectric layer; and forming a cap layer between the gate and the high dielectric constant dielectric layer.

* * * * *